US006614056B1

United States Patent
Tarsa et al.

(10) Patent No.: US 6,614,056 B1
(45) Date of Patent: Sep. 2, 2003

(54) SCALABLE LED WITH IMPROVED CURRENT SPREADING STRUCTURES

(75) Inventors: Eric J. Tarsa, Goleta, CA (US); Brian Thibeault, Santa Barbara, CA (US); James Ibbetson, Goleta, CA (US); Michael Mack, Santa Barbara, CA (US)

(73) Assignee: Cree Lighting Company, Goleta, CA (US)

( * ) Notice: Subject to any disclaimer, the term of this patent is extended or adjusted under 35 U.S.C. 154(b) by 0 days.

(21) Appl. No.: 09/721,352

(22) Filed: Nov. 21, 2000

Related U.S. Application Data
(60) Provisional application No. 60/168,338, filed on Dec. 1, 1999.

(51) Int. Cl.[7] .............................................. H01L 29/205
(52) U.S. Cl. .......................... 257/91; 257/88; 257/94; 257/99; 257/773
(58) Field of Search ............................. 257/91, 94, 99, 257/773, 88

(56) References Cited

U.S. PATENT DOCUMENTS

| | | | | |
|---|---|---|---|---|
| 5,309,001 A | * | 5/1994 | Watanabe et al. | 257/778 |
| 5,652,434 A | | 7/1997 | Nakamura et al. | 257/13 |
| 5,696,389 A | | 12/1997 | Ishikawa et al. | 257/99 |
| 5,698,865 A | * | 12/1997 | Gerner et al. | 257/103 |
| 5,793,405 A | * | 8/1998 | Shakuda | 347/238 |
| 5,898,185 A | * | 4/1999 | Bojarczuk et al. | 257/102 |
| 5,923,052 A | | 7/1999 | Kim | 257/91 |
| 5,959,316 A | | 9/1999 | Lowery | 257/98 |
| 6,307,218 B1 | * | 10/2001 | Steigerwald et al. | 257/94 |

FOREIGN PATENT DOCUMENTS

| | | |
|---|---|---|
| EP | 0921577 A1 | 6/1999 |
| JP | 08064822 | 3/1996 |
| JP | 10173230 | 6/1998 |
| JP | 10321912 | 12/1998 |
| WO | WO 9723912 | 7/1997 |

OTHER PUBLICATIONS

Nichia Corp Part Specification, *High Brightness Leds*, May 1999, pp. 1–3 (NSPW 300BS, NSPW 312 BS, ETC).

G.B. Stringfellow and M.C. Crawford *High Brightness Light Emitting Diode, Semiconductors and Semimetals*, vol. 48, pp. 170, 178 (1997).

Chuang, R et al., *Contact Resistance of InBaN/GaN Light Emitting Diodes*, 1998, XP000997278.

Patent Abstracts of Japan, Pub.Date: Oct. 1998, Pub. No. 10275934.

* cited by examiner

*Primary Examiner*—Vu A. Le
*Assistant Examiner*—Doug Menz
(74) *Attorney, Agent, or Firm*—Koppel, Jacobs, Patrick & Heybl

(57) ABSTRACT

An LED with improved current spreading structures that provide enhanced current injection into the LED's active layer, improving its power and luminous flux. The current spreading structures can be used in LEDs larger than conventional LEDs while maintaining the enhanced current injection. The invention is particularly applicable to LEDs having insulating substrates but can also reduce the series resistance of LEDs having conductive substrates. The improved structures comprise conductive fingers that form cooperating conductive paths that ensure that current spreads from the p-type and n-type contacts into the fingers and uniformly spreads though the oppositely doped layers. The current then spreads to the active layer to uniformly inject electrons and holes throughout the active layer, which recombine to emit light.

10 Claims, 8 Drawing Sheets

SCALABLE LED WITH IMPROVED CURRENT SPREADING STRUCTURES

This application claims the benefit of provisional application No. 60/168,338 to Tarsa et al., which was filed on Dec. 1, 1999.

This invention was made with Government support under Contract No. N0178-99-C-3058, awarded by the BMDO SBIR. The Government has certain rights in this invention.

BACKGROUND OF THE INVENTION

1. Field of the Invention

The present invention relates to light emitting diodes (LEDs) and more particularly to LEDs having improved current spreading structures.

2. Description of the Related Art

LEDs are an important class of solid state devices that convert electric current to light. They generally comprise an active layer of semiconductor material sandwiched between two oppositely doped layers, one being p-type and the other being n-type. A drive current is applied across electrical contacts on the doped layers causing electrons and holes to be injected from the doped layers into the active layer. The electrons and holes then recombine to generate light that emits omnidirectionlly from the active layer and escapes from all surfaces of the LED.

One disadvantage of most conventional LEDs is that they are less efficient at converting current to light than are filament lights. As a result, their use has most often been limited to applications such as indicating lamps in electronic devices, where the LED's die size is less than 0.25 mm$^2$ and where optical power is less than 10 milliwatts (mW).

However, recent advances in nitride based semiconductor materials has led to the development of bright, highly efficient LEDs emitting in the blue-green spectral region which can be used to generate various colors of light, including white light. [See Nichia Corp. white LED, Part No. NSPW300BS, NSPW312BS, etc.; See also U.S. Pat. No. 5,959,316 to Hayden, "Multiple Encapsulation of Phosphor-LED Devices"]. These advancements have led to solid state emitters for use in lighting and signaling applications that require high output power and high luminous flux. One such application is traffic signals. Current LED traffic signals consist of an array of single LED devices combined to obtain high output power. However, a single high-power LED device that can replace the LED array would be less complex, cost less and would be more reliable.

One way to increase the power and luminous flux of an LED is to increase its size and emitting surface area. However, the size of conventional nitride based LEDs is limited by the inability of current to effectively spread from the electrical contacts to the active layer. P-type nitride based semiconductor materials have relatively poor conductivity, and current applied to the p-type contact will only spread to a limited area within the p-type layer. The current will not migrate to the entire active layer, and the LED can experience local heating and premature degradation around the contact.

N-type nitride based semiconductor materials are better conductors but still present some resistance to the spread of current. As the device size increases, the material's ability to uniformly spread current from the n-type contact is reduced. As a result, the size of nitride base LEDs is limited by both the p- and n-type layers' current spreading characteristics.

Various LEDs have been developed with structures to increase current spreading [See G. B. Stringfellow and M. G. Crawford (1997), *High Brightness Light Emitting Diodes*, Semiconductors and Semimetals, Vol. 48, Pages 170–178]. The devices generally include an n-type epitaxial layer grown on a conductive substrate, with a LED active region and p-type layer grown on the n-type layer. A conductive contact is deposited on the center of the p-type layer's surface and a conductive contact pad is deposited on the conductive substrate opposite the epitaxial layer. Current from the p-type contact spreads from the center towards the edges of the p-type layer, and then to the active layer. The substrate is very thick compared to the epitaxial layers and as a result, the overall current spreading into the active region is limited by the spreading provided by the p-type contact. This basic structure is effective for small LEDs (approximately 0.25 mm$^2$), but is not scalable to larger LEDs. In order to facilitate LED size scaling, modifications to the LED must be made.

One such modification increases the thickness of the p-type layer to decrease its spreading resistance so that current spreads to the edge of the LED. This approach is effective in increasing the LED area, but the LED scaling is practically limited because the p-type layer thickness cannot be increased indefinitely. Also, for the GaN-based LED system, the p-type material has very low conductivity, making this approach impractical.

In another approach, contacts have been deposited in the center of the p-type layer's surface with thin radial conductive fingers running from the contact toward the edge of the surface. Current applied to the contact spreads to the conductive fingers and to the p-type surface below. While an improvement, the LED still cannot be freely scaled to large sizes. As the size increases, the distance between the ends of the radial fingers increases and a point is reached at which this distance prevents current from spreading throughout the p-type layer. This structure also cannot be used on LEDs fabricated on an insulating substrate.

U.S. Pat. No. 5,652,434 to Nakamura et al. discloses a structure that improves current spreading in nitride based LEDs grown on insulating substrates. It comprises an LED structure on the insulating substrate, with the n-type layer adjacent to the substrate and the p-type layer on the epitaxial layer surface. Because the substrate is insulating, a contact pad cannot be used to spread current through the substrate and to the n-type layer. Instead, a corner of the LED structure is etched through the p-type layer, the active layer, and partially into the n-type layer. A contact is deposited on the etched area so that current applied to the contact spreads through the relatively conductive n-type material. To spread current across the p-type layer, a semi-transparent current spreading layer is deposited on the p-type layer. A p-type contact is deposited on the spreading layer in the corner of the LED opposite the n-type contact. The current applied to the p-type contact will spread through the spreading layer and to the p-type layer below it.

This structure provides an improvement in spreading current in standard size devices, but cannot efficiently spread current in larger sized LEDs. Because the p-type layer is an LED surface, the spreading layer should be as thin as possible so that it will not absorb emitted light. However, the thinner the spreading layer the greater its sheet resistance. As the LED size increases the sheet resistance prevents the current from fully spreading across the p-type layer. The spreading layer's sheet resistance can be reduced by using semi-transparent metallic materials, and/or increasing its thickness. However, these changes would reduce transparency and increase light absorption, reducing the LED's light output.

Also, the increased spreading resistance in the n-type layer can cause excessive heating, and prevent full current spreading and uniform light output. To reduce the spreading resistance, the thickness of the n-type layer can be increased as the device size increases. However, this significantly increases the necessary materials and process times, both of which can result in prohibitive cost increases.

SUMMARY OF THE INVENTION

The present invention provides an improved LED with new current spreading structures. The improved LED can be standard sized or scaled to larger sizes, allowing for increased power output and luminous flux. Its new current spreading structures provide improved current spreading in the p- and n-type layers for both small and large LEDs. The result is an improvement in the injection of holes and electrons into the LED's active layer, thereby improving its light emitting efficiency and reducing its series resistance and heating.

The new LED generally includes an LED core having an epitaxially grown p- and n-type layers, and an epitaxially grown active layer between p- and n-type layers. A first current spreader layer is included adjacent to the LED core. At least one groove is formed through the LED core to the spreader layer, with a first contact having at least one first conductive finger on said first spreader layer within the grooves. Current flows from the first contact, into its conductive finger, into the first spreader layer and into the LED core. A second contact having at least one second conductive finger is included on the LED core opposite the first conductive layer, such that current flows from the second contact, into its second fingers and into the LED core.

The new LED can also include a second spreader layer on the LED core opposite the first spreader layer. It is disposed between the second contact and fingers, and the LED core. The spreader layer is more conductive than the LED core layer adjacent to it thereby allowing current to more freely flow from the contact and fingers, into the second spreader layer and throughout the LED core.

In one embodiment of the new LED, the first spreader layer is an n-type epitaxial layer and is grown on a substrate such that it is sandwiched between the substrate and LED core. A transparent or semitransparent second spreader layer is deposited on the surface of the LED core opposite the first spreader layer, with the second contact and its fingers formed on the second spreader layer.

The LED's contacts and their respective conductive fingers are disposed to provide improved current spreading and injection of holes and electrons into the LED's active layer. A bias is applied across the contacts, spreading current from each contact through their respective conductive fingers. The distance between the adjacent first and second fingers is kept nearly uniform and is small enough that current will effectively spread across the LED core. This provides uniform current injection into the LED core's active layer. Using the new current spreading structures, the new LED can be scaleable to sizes much larger than conventional LEDs while maintaining the same current spreading relationship between adjacent fingers.

The contact and fingers on the LED core do not cover the core's entire surface, leaving a majority of the surface for the emission of light. As a result, thick, low resistance metal can be used in the fingers to provide an efficient current spreading path. These fingers also reduce the distance that current must spread in the second spreader layer. Accordingly, the thickness of the current spreading layer can be reduced, which reduces its absorption of emitting light. Also, by providing one or more fingers on the second spreader layer to spread current to the LED core, the thickness of the layer does not need to be increased as the size of the LED increases. The long process times and increased cost associated with thick epitaxial layers are thereby avoided.

The advantages of the new LED structure are realized for LEDs on conductive and insulating substrates since the new structures provide nearly uniform current injection, regardless of substrate type. The epitaxial layer configuration can also be reversed in this structure, with the p-type layer being the layer next to the first spreader and the n-type layer being on the epitaxial surface. The current spreading configuration remains the same. The invention provides for a fully scalable device through the increase in the number of fingers as the device size is increased.

These and other further features and advantages of the invention will be apparent to those skilled in the art from the following detailed description, taken together with the accompanying drawings, in which:

DETAILED DESCRIPTION OF THE INVENTION

FIGS. 1–12 show various embodiments of a new LEDs constructed in accordance with the present invention, each having improved current spreading structures. The new structures can be used in LEDs formed from any semiconductor material system, but are particularly applicable to Group-III nitride based LEDs fabricated on substrates such as silicon carbide (SiC) or sapphire. SiC has a much closer crystal lattice match to Group III nitrides such as GaN and results in Group III nitride films of high quality. Silicon carbide also has a very high thermal conductivity so that the total output power of Group III nitride devices on silicon carbide is not limited by the thermal dissipation of the substrate (as is the case with some devices formed on sapphire). SiC substrates are available from Cree Research, Inc., of Durham, North Carolina and methods for producing them are set forth in the scientific literature as well as in a U.S. Pat., Nos. Re. 34,861; 4,946,547; and 5,200,022.

Figure 1:
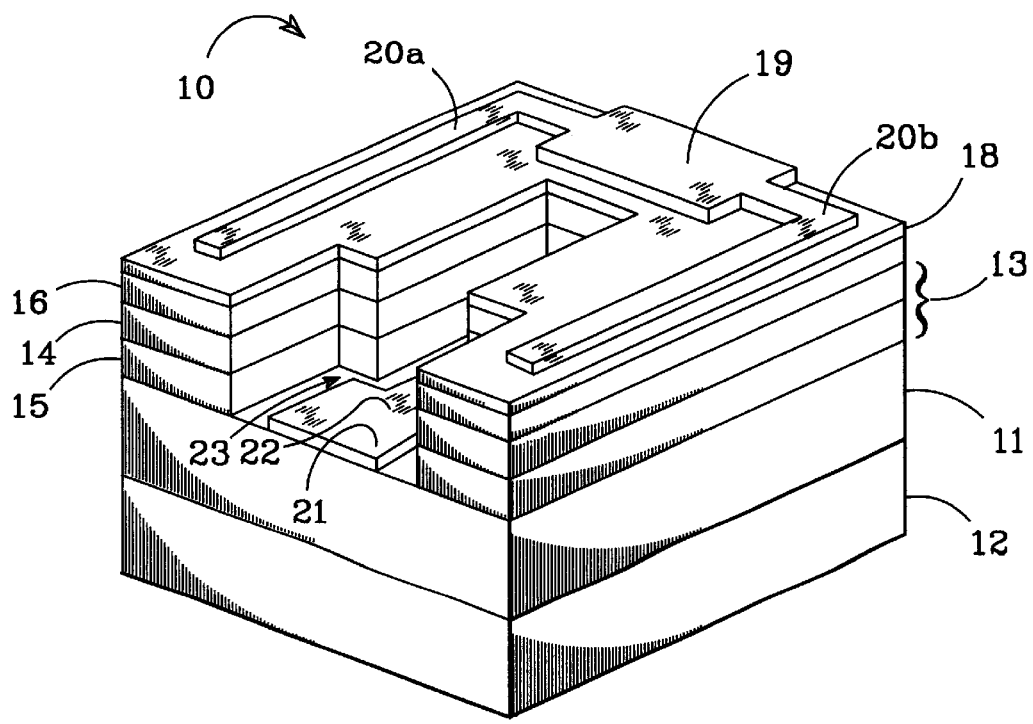
FIG. 1 is a perspective view of a new standard sized LED with a new current spreading structure.
Figure 2:
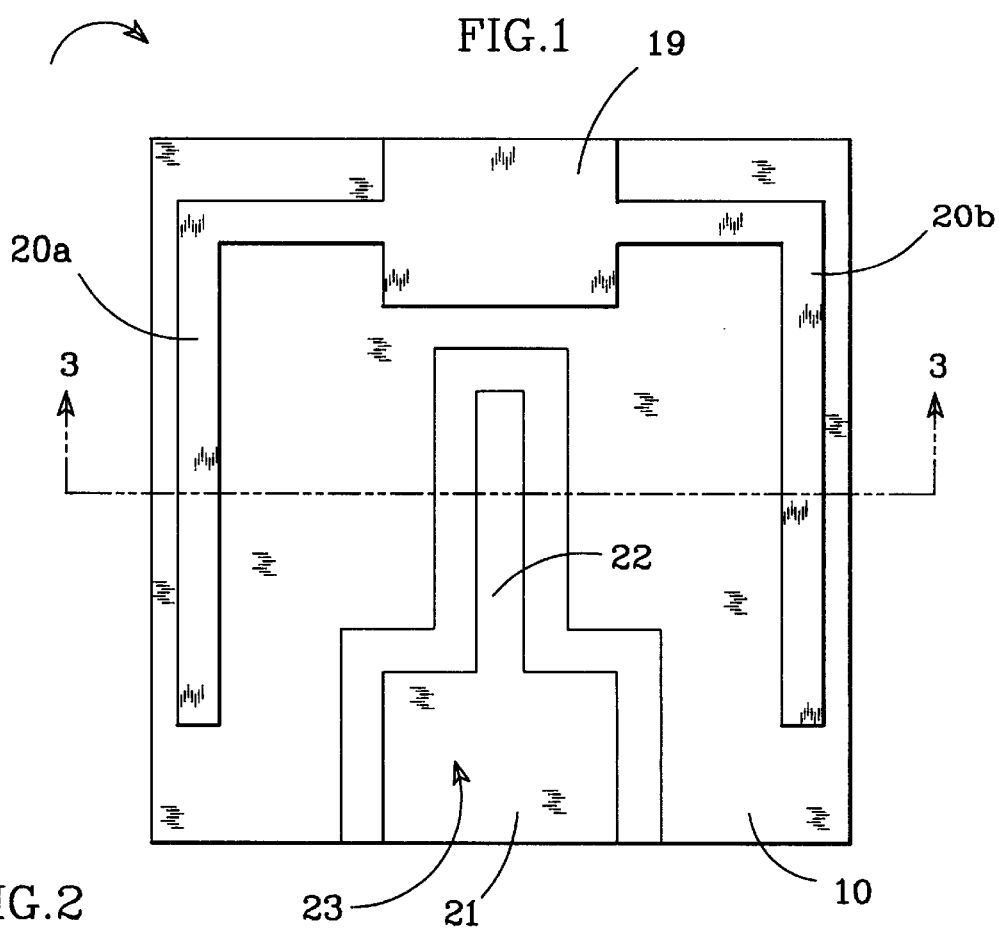
FIG. 2 is a plan view of the LED in FIG. 1.
Figure 3:
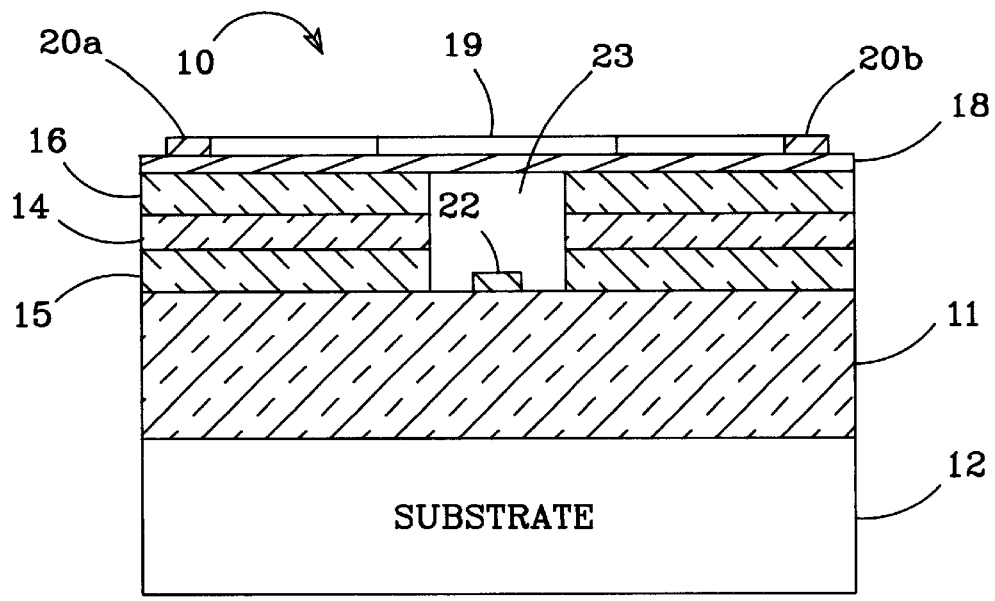
FIG. 3 is a sectional view taken along the section line 3—3 of FIG. 2.

FIGS. 1, 2 and 3 show a new square LED 10 having a conductive layer 11, denoted first spreader layer, sandwiched between a substrate 12 and an LED core 13. The core 13 comprises an epitaxially grown active layer 14 sandwiched between epitaxially grown conductive layers 15 and 16. Conductive layer 15 is the same type, n or p, as first spreader 11, while conductive layer 16 is of the other type, n or p. In the preferred embodiment, layer 15 is n-type, layer 16 is p-type, and the first spreader layer is n-type.

The first spreader 11 has a thickness and doping level that facilitates current spreading to the active layer 14. Preferred doping levels are 1e15 cm-3 to 1e21 cm-3 and preferred thickness are 0.2 $\mu$m to 100 $\mu$m. Layers 11,14,15,16 can be fabricated on the substrate 12 by conventional methods such as growth in a MOCVD reactor or by a combination of growth techniques such as VPE and MOCVD.

A current spreading layer 18, denoted second spreader layer, is deposited on conductive layer 16 to facilitate current spreading across conductive layer 16 and into the active layer 14. This layer 18 may be a MOCVD grown semiconductor of the same doping type as conductive layer 16, with a similar thickness range and doping range as first spreader 11. The second spreader 18 may also be formed of a transparent or semitransparent conducting material. Preferred materials are thin metals or thin metal combinations of 1 nm to 50 nm in total thickness or transparent conductors such as ITO which can be thicker.

A second contact 19 having two second conductive fingers 20a and 20b, is deposited on the second spreader 18. The second contact and fingers extend adjacent to three of the conductive layer's edges, forming a U-shaped path that stops short of the edge opposite the contact 19. The outer boundary of fingers 20a and 20b can extend up to the edges of the conductive layer 16 or can be back somewhat from the edges such that a small area of the second spreader 18 shows between the fingers 20a and 20b.

To enhance current spreading evenly across the device, a first contact 21 and first conductive finger 22 are deposited on the surface of the first spreader 11. To provide an area on this surface, a section of LED core is etched down to the first spreader 11, resulting in a groove/channel 23 through the LED core. The first contact 21 and finger 22 are deposited on the first spreader within the groove.

The LED core 13 can be etched using conventional methods such as chemical or ion mill etching. The conductive layer 18, the contacts 19 and 21, and their fingers, can be deposited by many conventional methods such as evaporation, sputtered, or electro plating.

In operation, a bias is applied to contacts 19 and 21. Current from contact 21 spreads down its finger 22 and to the conductive first spreader 11. The current spreads throughout the first spreader 11 and carriers are nearly uniformly injected into the LED active region 14 through layer 15. Current spreads from the contact 19 into fingers 20a and 20b, and then throughout the second spreader layer 18. The carriers are nearly uniformly injected into the LED active region 14 through layer 16. The electrons and holes recombine in the active layer 14 to provide near uniform and highly efficient light emission.

The new LED 10 and its current spreading structure can take many different shapes and sizes. FIGS. 1–3 show a square LED that can be standard sized (approximately 0.25 mm$^2$), smaller or larger. As the size of the LED 10 increases, the distance between the conductive fingers also increases. Its size is limited by the ability of current to spread from the fingers and provide uniform injection into the active layer.

The preferred current spreading fingers have a piecewise rectangular shape. The second fingers range from 0.1 micron to 30 microns in width with the preferred width being 2–10 microns. Wider fingers can effectively spread the current but will block or absorb more of the light emitting from the p-type layer 16. The first fingers can range from 0.1–30 microns in width. Wider fingers require more of the LED structure to be etched down to the epitaxial layer, reducing the amount of the active layer that can emit light. The distance between the first and second fingers can be from 5–500 microns. The smaller the distance the better the current spreading within the current spreading layer but the more area that will be covered by the light absorbing fingers. The thickness of the fingers can range from 0.05 to 3 microns. The thicker the finger the lower its series resistance but the longer and costlier its manufacturing.

The new structure provides many advantages over the prior art. The contacts 19 and 21, and their respective conductive fingers, 20a, 20b and 22, are made of a conductive material which has a low series resistance. Current flowing from the contacts to the fingers experiences little spreading resistance and provides an efficient path to distribute current. Also, the current spreads a much smaller distance from the current spreading contact 19 and its fingers 20a and 20b to fully spread within the second spreader layer 18. As a result, the current spreading layer's thickness can be reduced which can reduce light absorption and increases light output if a semi-transparent material is used for the second spreader 18. Full current spreading to the p-type layer 16 and uniform injection into the active layer 14 is maintained. The distance between the epitaxial and current spreading fingers should remain nearly uniform to ensure uniform current spreading in the respective doped layers and to the active layer 14.

As mentioned above, the second fingers 20a and 20b will absorb some of the LED's emitting light. Also, the etching of the LED core to provide a groove 23 reduces the size of LED core that can contribute to light emission. However, the uniform injection of current into the active layer 14 overcomes these disadvantages and results in an LED with overall increased efficiency. In fact, the groove 23 may enhance overall light output. This is because light is emitted omnidirectionally from the LED's active layer 15. For LEDs with a planar surface, a percentage of the light will be reflected back from LED's surface and experience total internal reflection. Eventually the light will be absorbed or escape out the side surfaces of the LED. By etching the LED structure to provide one or more grooves, light reflecting within the LED can reach the grooves, increasing the chances that it will escape. This enhances the probability that the light will emerge and contribute to illumination without being absorbed.

Figure 4:
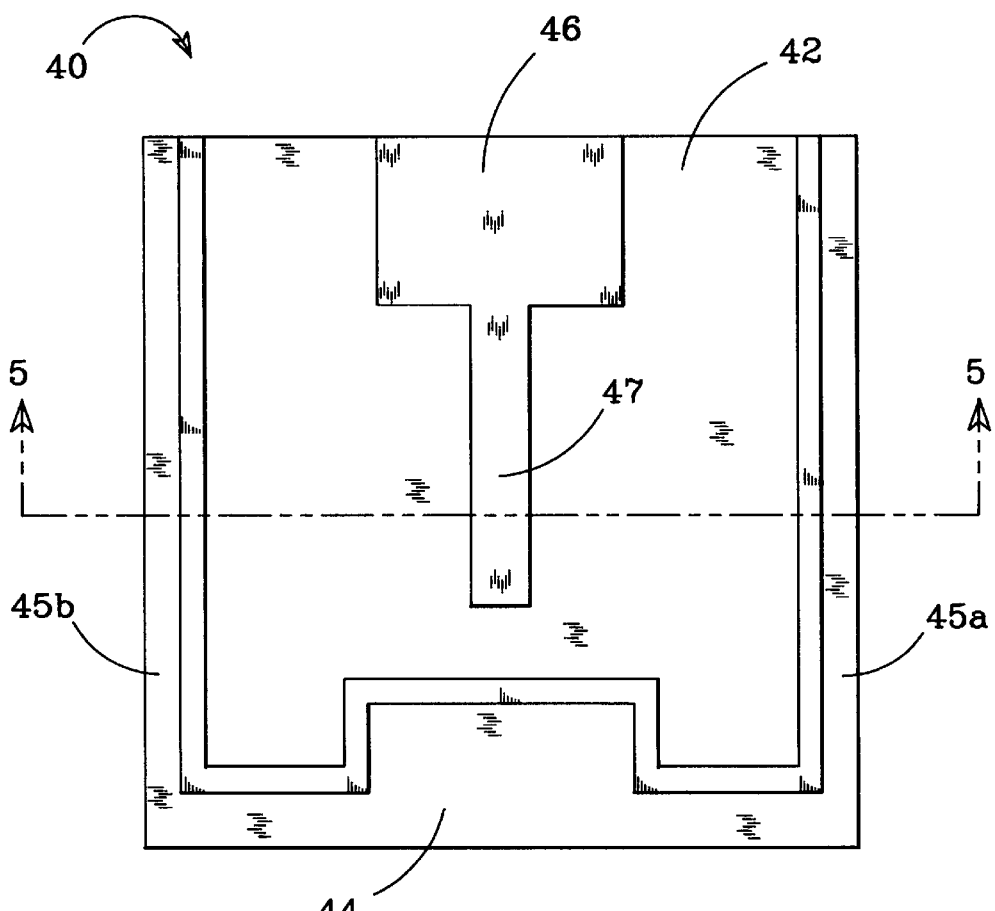
FIG. 4 is a plan view of a new standard sized LED with a new current spreading structure including a center finger on the second spreading layer and fingers on the first spreading layer around the LED's perimeter.
Figure 5:
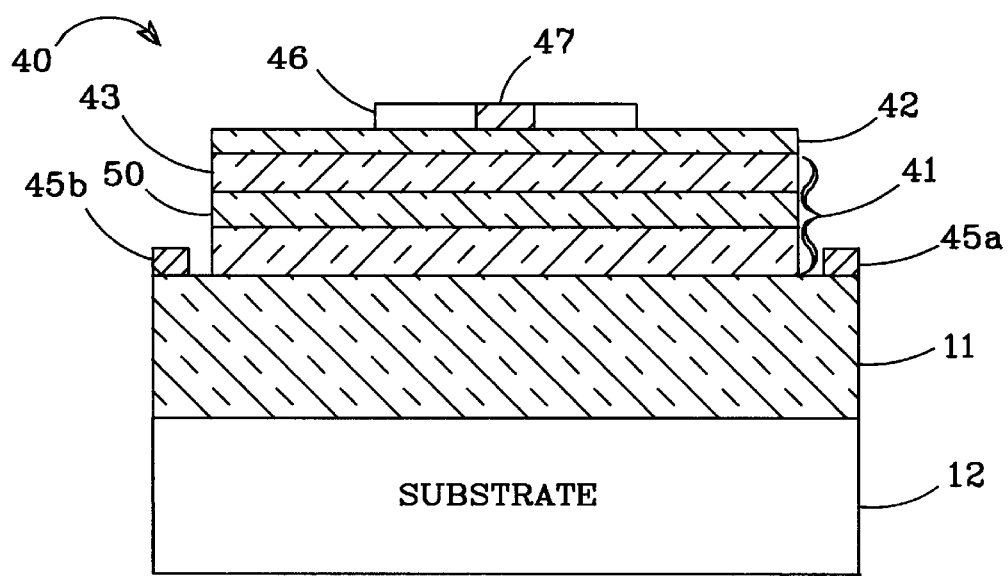
FIG. 5 is a sectional view of LED shown in FIG. 4.

FIGS. 4 and 5, show another embodiment of the new LED 40 that is similar to the LED in FIGS. 1–3. It has the same substrate 12 and first spreader layer 11. It also has a similar LED core 41 and second spreader layer 42 deposited on the LED core's conductive layer 43.

However, in this embodiment the first contact and fingers spread current from the edge of the first spreader layer 11 and the second contact and finger spreads current from the center of the second spreader layer 42. The LED core 41 is etched to the first spreader layer 11, around the LED's perimeter on three of its sides. The first contact 44 is deposited on the first spreader layer 11 at the midpoint of the middle side. The first fingers 45a and 45b are deposited on the first spreader layer 11 and run in opposite direction from the first contact 44 around the etched sides. Current spreads to the first spreader layer's perimeter from the first contact 44, through its fingers 45a and 45b. A second contact 46 is deposited on the second spreading layer 42 on its edge opposite the first contact 44. It has one conductive finger 47 that is also deposited on the second spreader layer and runs from the contact 46, down most of the LED's center line, in the direction of the epitaxial layer contact 44.

The LED 40 has the same current spreading advantages as LED 10. The current is spread from the contacts 44 and 46 through their respective conductive fingers that have low series resistance. The current from the first contact 44 and its fingers 45a and 45b spreads throughout the first spreader layer 11 and to the LED core 41. The current from the current second contact 46 and its finger 47, spreads into the second spreader layer 42 and into the LED core 41. Just as in LED 10, the distance that the current must spread from the finger 47 through the second spreader layer 42, to cover the entire LED core 41, is reduced. As a result, the thickness of the second spreader layer 42 can be reduced, which reduces light absorption. Distance between the second finger 47 and the first fingers 45a and 45b, where they overlap, is nearly uniform, resulting in more uniform current injection into the LED core's active layer 50.

Figure 6:
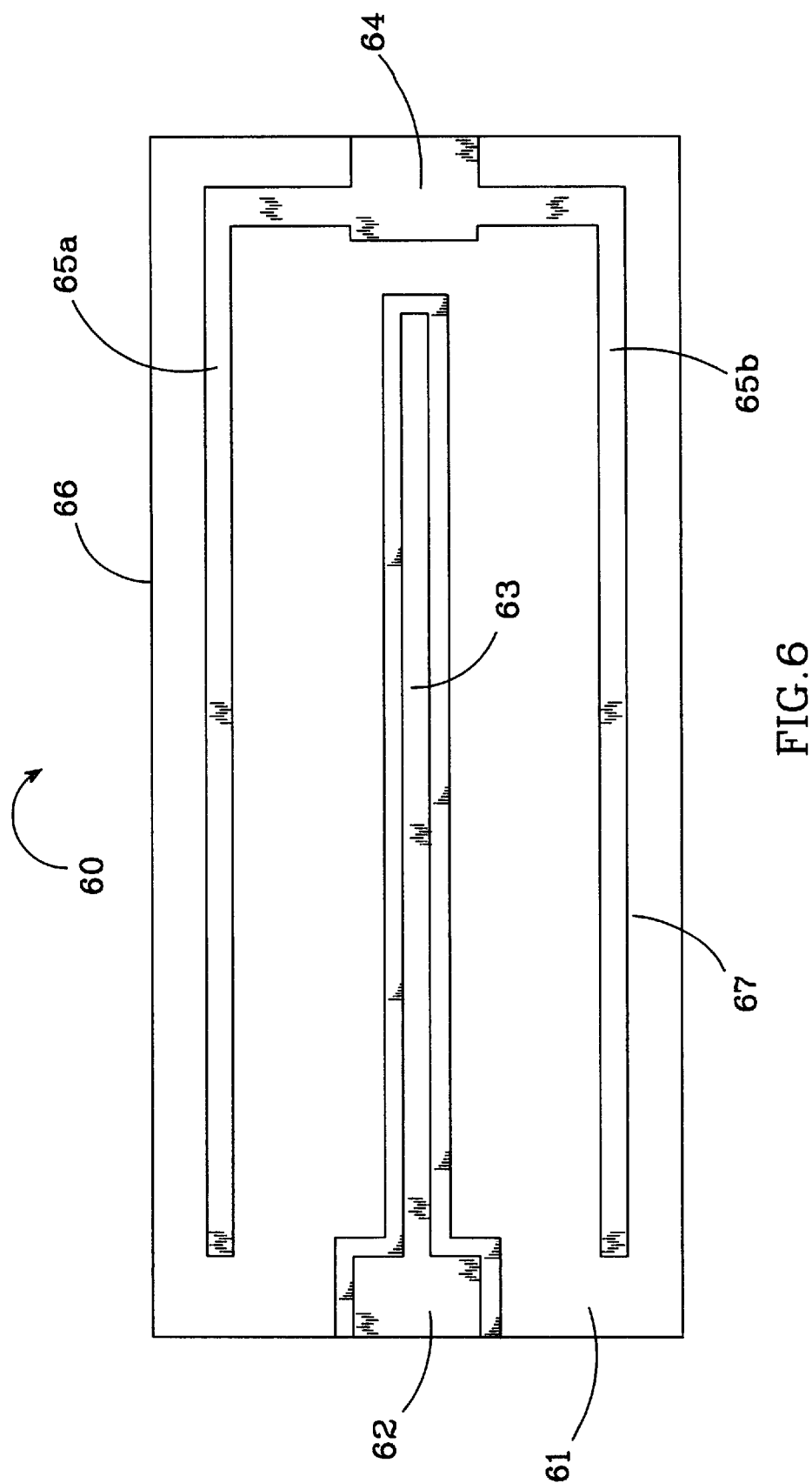
FIG. 6 is a plan view of a new scaled, rectangular shaped LED using the new current spreading structure shown in FIG. 1.

An important advantages of the new current spreading structure is that it can be used on larger LEDs while maintaining the improved current spreading. FIG. 6 shows a new LED 60 having a current spreading structure similar to LED 10 in FIGS. 1, 2 and 3. LED 60 has a substrate, a first spreader layer, a LED core (all of which are not visible in FIG. 6), and a second spreader layer 61, all of which are similar to those in LED 10. Part of the LED core is etched to the first spreader layer for depositing an n contact 62 and finger 63. A second contact 64 and its conductive fingers 65a and 65b are also deposited on the second spreader layer 61 with the fingers running around the LED's perimeter.

LED 60 is larger than LED 10 having a rectangular shape with the length of two of its sides 66 and 67 increased. The improved current spreading is maintained by increasing the length of the first finger 63 and second fingers 65a and 65b the same amount that the sides 66 and 67 are increased. The distance between the first finger 63 and second fingers 65a and 65b, where they overlap, remains uniform. The distance that the current must spread from the second fingers 65a and 65b through the current spreading layer 61 to cover the entire LED core, also remains constant. Similarly, the distance that the current must spread from the first finger 63 through the first spreader layer also remains constant. If length of sides 66 and 67 are increased further, the length of the fingers must also be increased to maintain the current relationship between the fingers.

A similar rectangular LED can be created based on the design shown in FIGS. 4 and 5. In these devices, the length of the fingers in the current spreading structure must be increased in the same way in order to provide uniform current spreading in rectangular LEDs.

An additional advantage of the LED 60 is that it is more efficient at dissipating heat than square LEDs with the same surface area. The heat generated within LED 60 travels a shorter distance to reach one of its edges where it can dissipate.

Another important advantage of the invention over the prior art relates to the first spreader layer thickness. This layer is usually n-type epitaxial and in prior LEDs, where current is spread from a contact through first spreader layer, an increase in LED size required an increase in the first spreader layer thickness to reduce its series resistance. By having the current spread from an first contact through one or more conductive first fingers, the increased series resistance is avoided. The first spreader layer thickness can remain the same, avoiding potential process time and cost increases.

Figure 7:
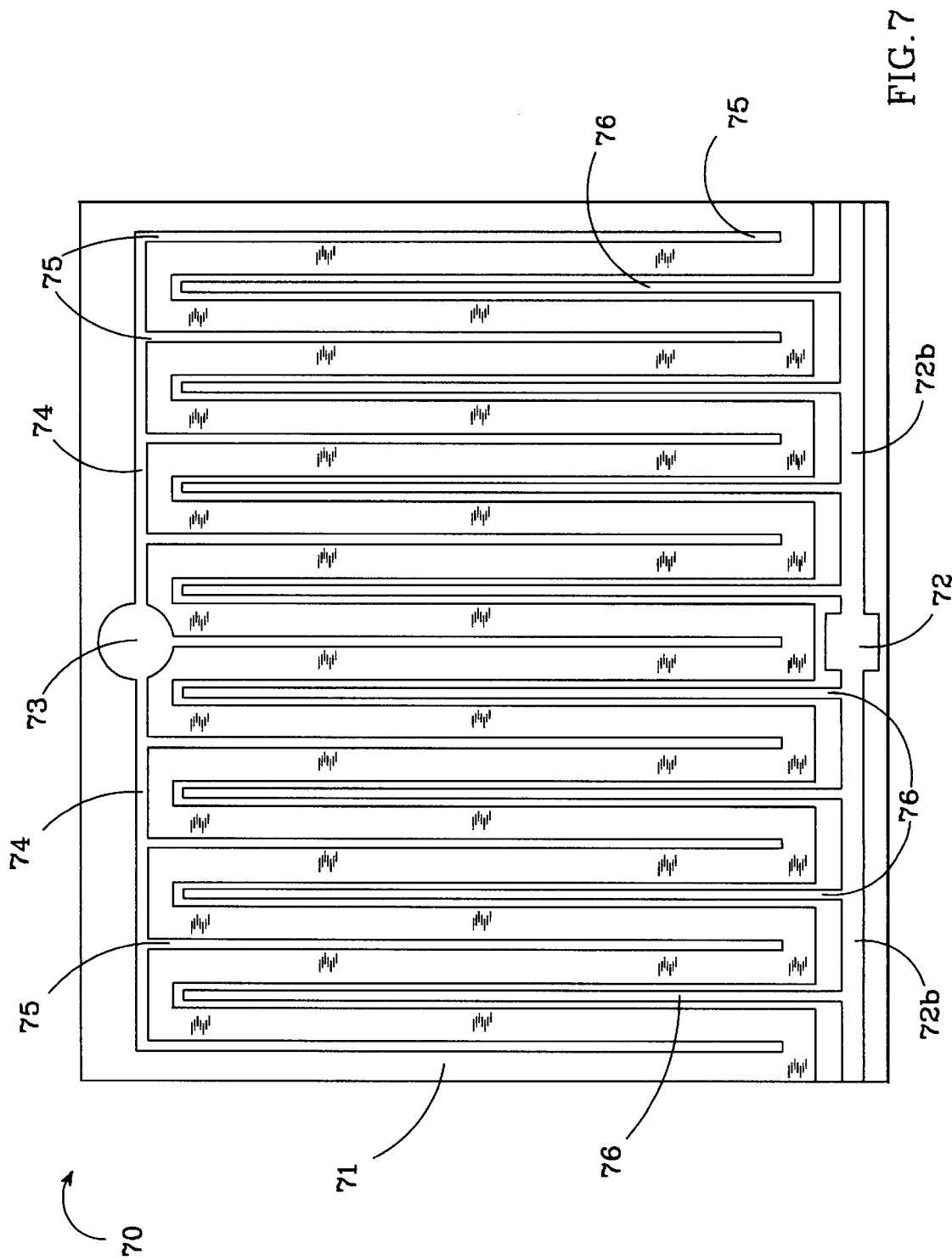
FIG. 7 is a plan view of a new LED using a new interdigitated multi fingered LED current spreading structure.

Another way of scaling the LED while maintaining the current spreading relationship between the conductive fingers is to increase the number of fingers as the area of the LED is increased. FIG. 7 shows an LED 70 having a larger surface area than LEDs 10 and 40 in FIGS. 1–5. It has a similar substrate, first spreader layer, LED core, (all of which are not visible in FIG. 7) and second spreader layer 71. As the surface area increases, the number of first and second fingers increases, maintaining a uniform distance between adjacent fingers.

The first and second contacts 72 and 73 can have many different shapes and sizes. The preferred second contact 73 is circular and is deposited on the second spreader layer 71, near one of the LED's edges. Two parts of a conductive branch 74 run in opposite directions on the second spreader layer 71, from the contact 73 and parallel to the adjacent LED edge. Numerous conductive fingers 75 extend at right angles from the branch 74, on the second spreader layer 71. The LED core is etched to provide an area on the first spreader layer for the first contact 72 and to provide grooves for the first fingers 76. The preferred first contact 72 is square and is deposited on the first spreader on the center of the LED's edge, opposite the p-contact 73. A branch 72b extends from the first contact 72 along the LED's edge. Its fingers 76 extend at right angles from the branch 72b, toward the branch 74. The distance between second and first fingers 75, 76 remains nearly uniform and small enough to provide near uniform injection into the LED's active layer. Thus, even though the LED 70 is larger than standard sized LED's, it experiences the same current spreading advantages of the above embodiments.

Figure 8:
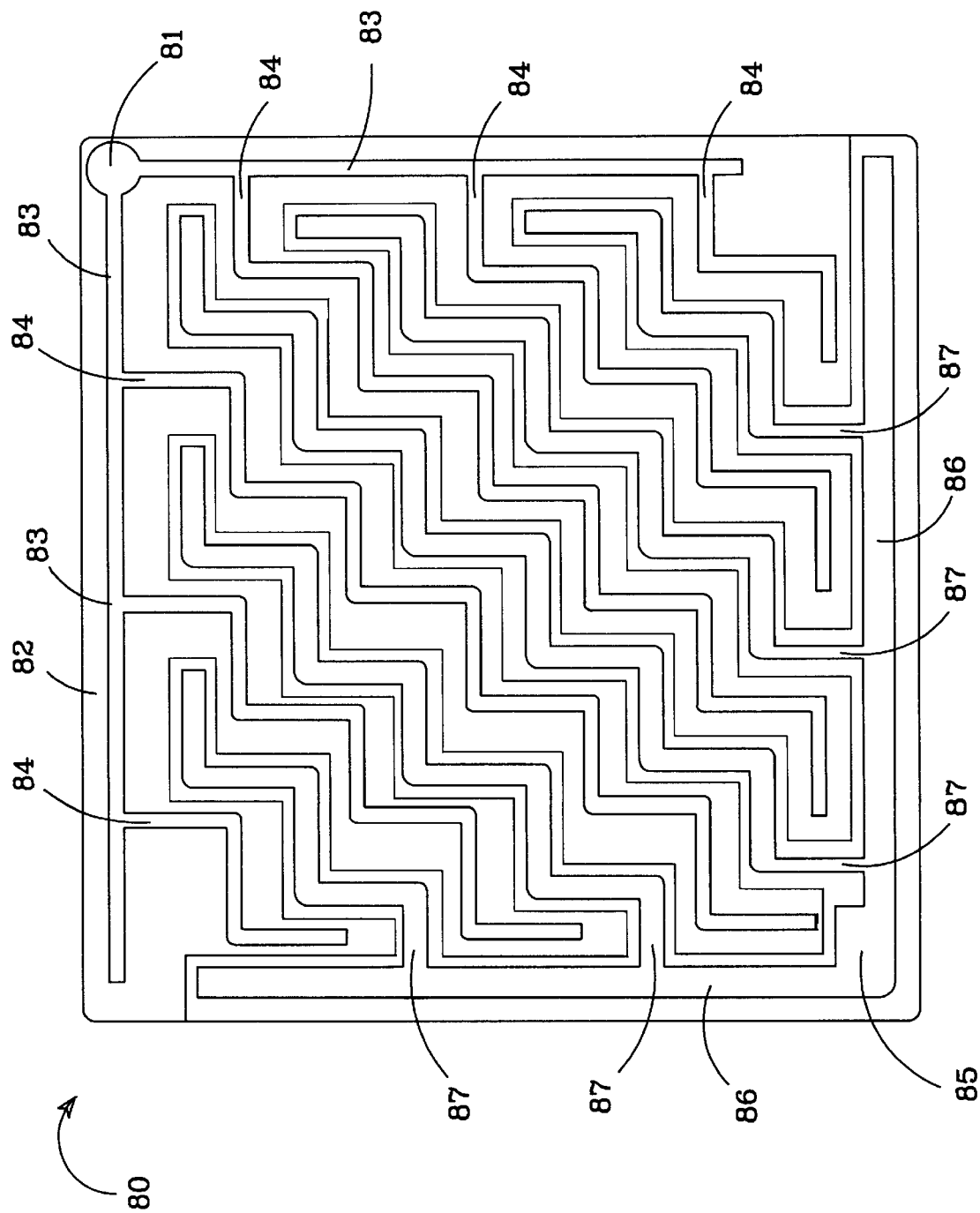
FIG. 8 is a plan view of a new LED having a new multi fingered zig-zag current spreading structure.

FIG. 8 shows another embodiment of the new LED 80 wherein the first and second fingers form zig-zag conductive paths. The LED 80 has the same layered structure as the above embodiments from the substrate through the second spreader layer. A circular second contact 81 is deposited in a corner of the LED, on the second spreader layer 82. A conductive branch 83 is also deposited on the second spreader layer and runs from the contact 81 along two sides of the LED's surface. Zig-zag shaped conductive second fingers 84 run from the branch 83 diagonally across the LED 80, on the second spreader layer 82. The fingers 84 initially project from the branch 83 at a right angle, and then bend at alternating right angles as they project across the LED 80. The shorter the finger, the fewer the number of right angle turns.

The LED 80 is also etched to its first spreader layer to provide grooves for a first contact 85, its branch 86, and its zig-zag shaped fingers 87. The first contact 85 is deposited on the first spreader layer at the LED's corner opposite the second contact 81. A conductive branch 86 is also deposited on the first spreader layer that runs from the first contact 85 around the perimeter of the LED 80 along the two edges not covered by the current spreading layer branch 83. First zig-zag fingers 87 having the same shape as the current spreading layer fingers 84 are also deposited on the first spreader layer between the fingers 84 such that the distance between the first and second fingers where they overlap, is nearly uniform. An alternative embodiment to this concept can use curved fingers to produce a zig-zag pattern with rounded corners instead of right angles.

This structure has all of the current spreading advantages of the embodiments above including lower series resistance, scalability, and the ability to use thinner current spreading layers. The zig-zag grooves etched in the LED structure for the first fingers 87 also serve to further improve the percentage of light that emits from LED 80. The edges of grooves vary more than the above embodiments, increasing the likelihood that internally reflecting light will escape and contribute to the LED's emission.

Figure 9:
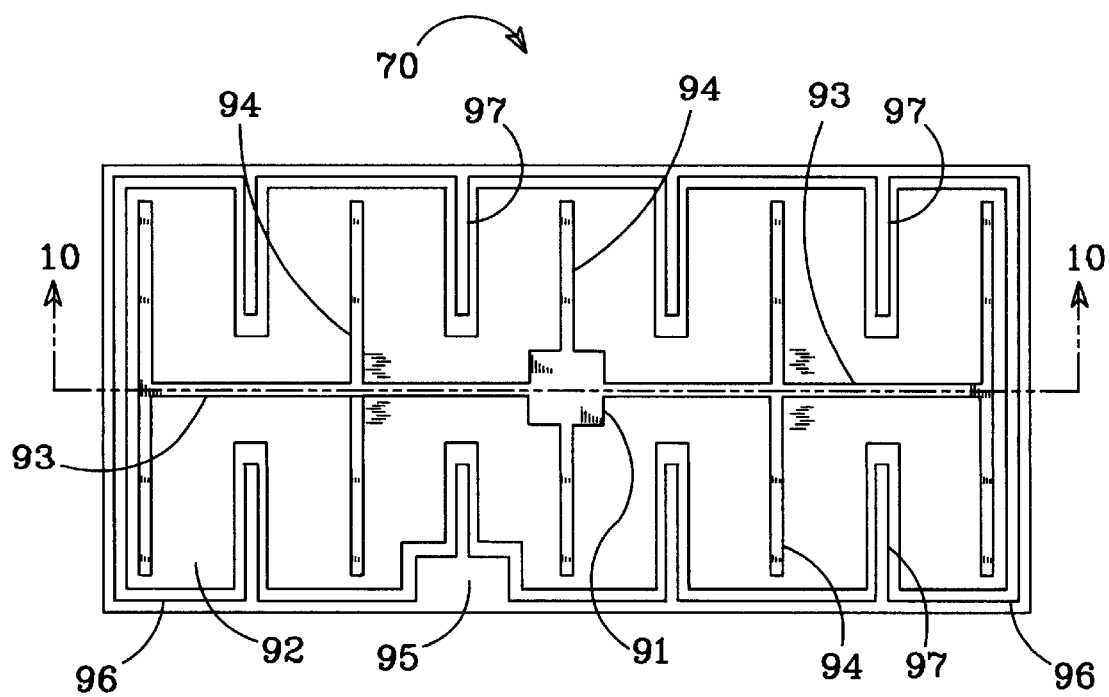
FIG. 9 is a plan view of a new LED having branches and fingers forming conductive paths from a central contact on the second spreading layer and cooperating fingers on the first spreading layer.
Figure 10:
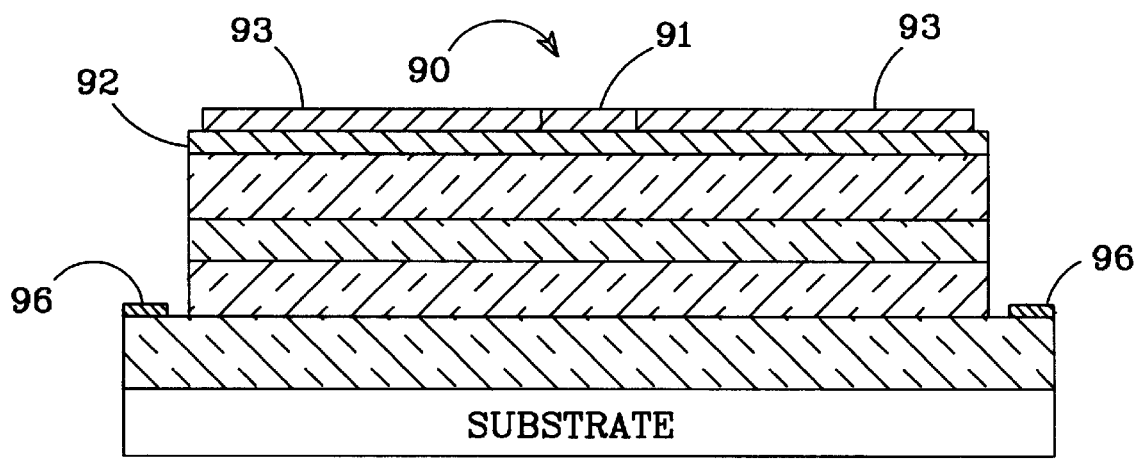
FIG. 10 is a sectional view of the LED in FIG. 9.

FIGS. 9 and 10 show another rectangular embodiment of new LED 90 having the same layered structure as the above embodiments. A second contact 91 is deposited in the center of the second spreader layer 92, with two parts of a conductive branch 93 running in opposite directions on the second spreader layer, from the contact 91 and down the LED's longitudinal centerline. Numerous conductive fingers 94 project at right angles from both sides of the branch 93 toward the LED's edge. To spread current to the LED's first spreader layer, the LED structure is etched around its perimeter down to the first spreader layer. A first contact 95 is deposited on the first spreader layer at the LED's edge. An first branch 96 is deposited on the first spreader layer around the LED's entire perimeter providing a continuous conductive loop from the contact 95. Grooves are also etched in the LED structure between the second fingers 94, at right angles from the perimeter toward the branch 93. First fingers 97 are deposited on the first spreader layer within the grooves, providing a conductive path from the first branch 96. The distance between adjacent first and second fingers, where they overlap, remains nearly uniform and this embodiment has the same current spreading advantages as the above embodiments.

Figure 11:
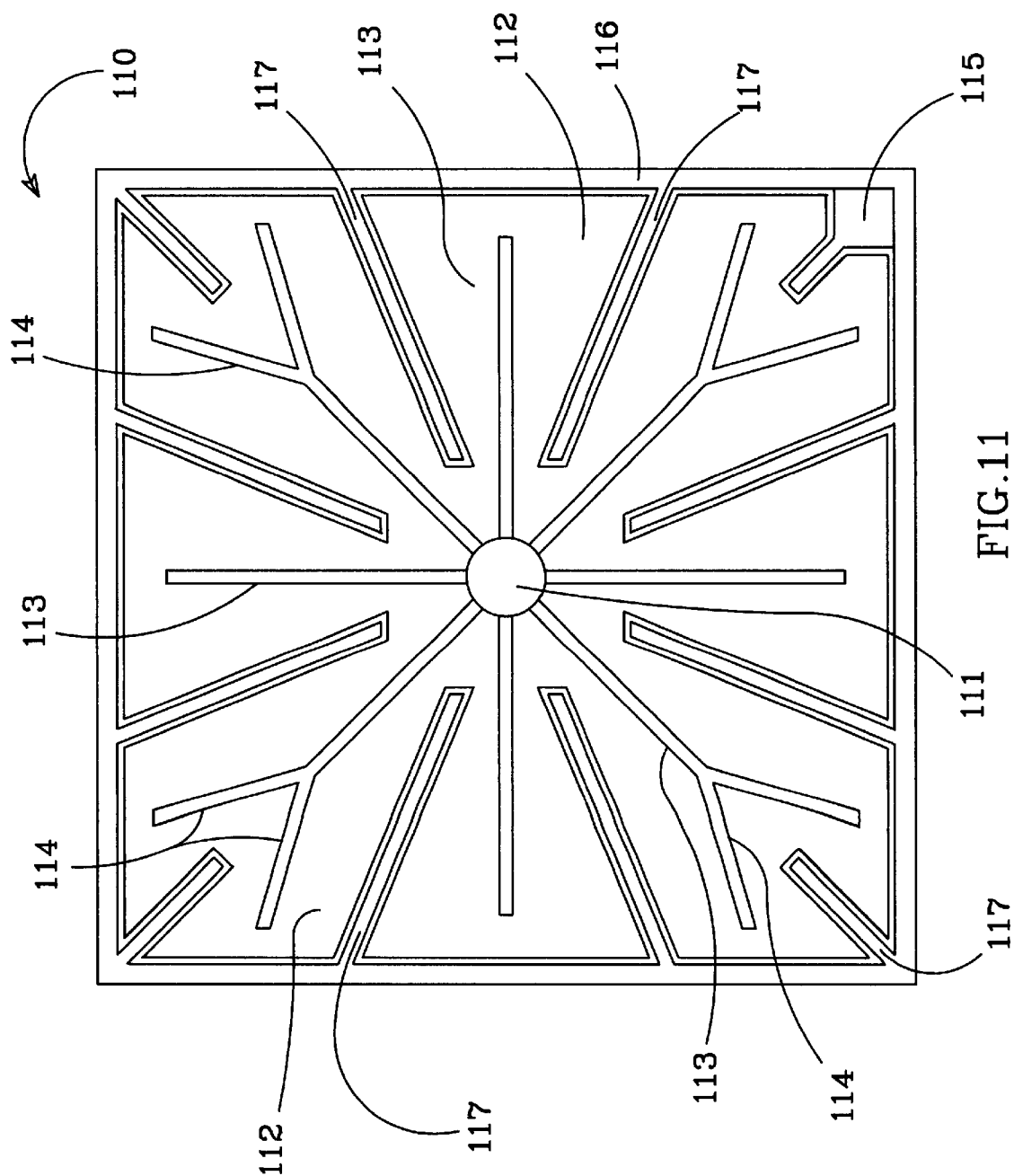
FIG. 11 is a plan view of a new LED having fingers radiating from a central contact on the second spreader.

FIG. 11 shows another embodiment of the new LED 110 having the same layer structure as the above embodiments. A second contact 111 is deposited in the center of the LED's second spreader layer 112. Conductive fingers 113 radiate form the contact 111 on the second spreader layer 112, toward the LED's edges with a uniform distance between the starting points of the fingers 113. As they radiate out from the contact 111, the distance between adjacent fingers increases. When the distance becomes too great to effectively spread current in the second spreader layer 112, the finger 113 splits into two fingers 114.

The LED is etched to its first spreader layer on its perimeter to provide for an first contact 115 and its perimeter branch 116. It is also etched to provide for first fingers 117 that form a conductive path in the direction of the second contact 111 and between the second fingers 113. If the split sections of fingers 114 are long enough, a first finger is included between them.

The distance between adjacent first and second fingers varies more than in the previous embodiments. However, the distance remains uniform enough that the LED 110 has the same current spreading advantages as the previous embodiments. This embodiment is also scaleable to larger sizes. As the surface area is increased the second fingers can continue to split with another first finger included between the splits.

Figure 12:
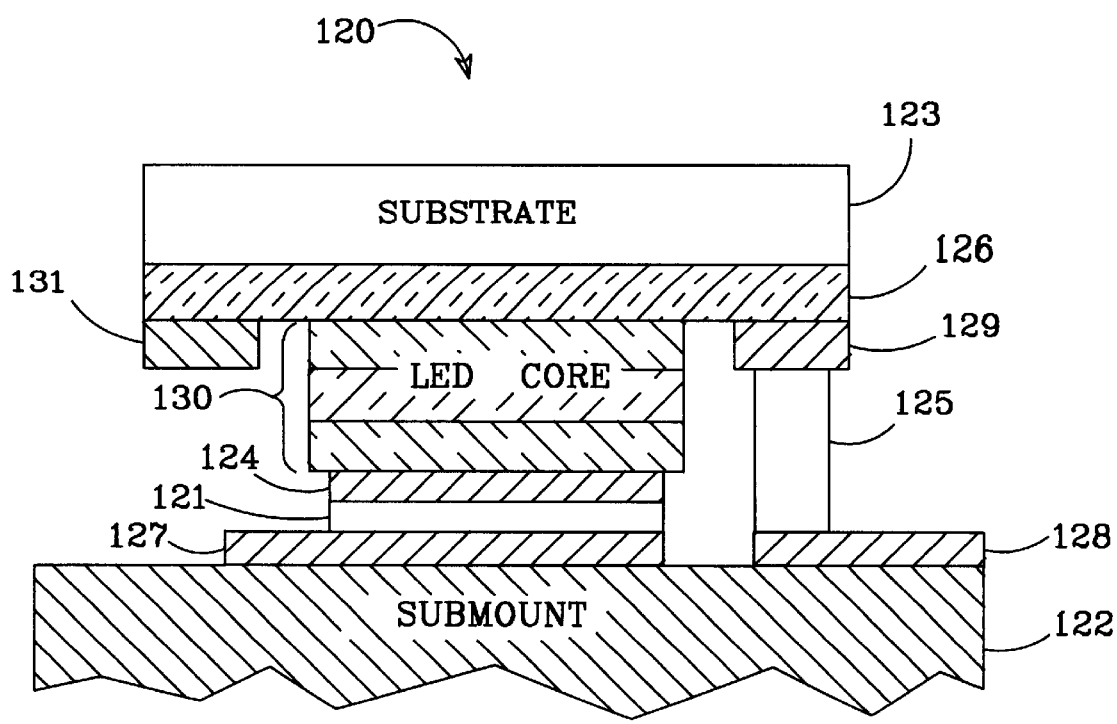
FIG. 12 is a sectional view of a new LED with new current spreading structures in a flip-chip geometry.

The embodiments above can also be grown on a transparent substrate and flip-chip mounted. FIG. 12 shows LED 120 grown on a transparent substrate 123 and has a structure similar to LED 40 in FIG. 4. It comprises and LED core 130 on a first spreader layer 126, and a second spreader layer 124 on the LED core opposite the first spreader layer. The LED is mounted to the submount 122 through the use of bond media 121 that connects either the second spreader 124 (as shown in FIG. 12) or the contact pad on the second spreader, to a first section of a conductive layer 127 that is also between the submount and bonding media 121. Bias applied to the conductive layer 127 sends current to the second spreader 124 and into the LED's active region. A second section of the conductive layer (or a contact) 128 is also on the submount and a second bond media 125 connects a first contact 129 on the first spreader 126 to conductive layer 128. Bias applied to conductive layer 128 sends current to first contact 129 which then transfers the current to the first spreader 126 through the first fingers 131. The first fingers are disposed on the first spreader layer, around its perimeter. Conductive layers 127 and 128 are electrically isolated through the submount 122 and serve as connection points for the LED package.

One of the advantages of this structure is that the LED has better heat sinking since the LED's generated heat is close to the bonding interface 121 and heat can be effectively transferred to the submount 122. The submount can have a high thermal conductivity and is of a larger surface area that the LED chip substrate 123. Also, if a semi-transparent layer is used for the second spreader layer 124, the flip-chip geometry allows for a reflector to be integrated with the semi-transparent layer to reduce the overall optical loss of the second spreader 124 and reflect light towards the substrate 123.

Also, because a reflector is placed over the second spreader, the second contact and fingers will not absorb any of the emitting light. Their thickness can be increased to reduce their series resistance, without the danger that they will absorb emitting light. Also, if the reflective surface is electrically conductive, the bond media 121 can be attached to the entire reflector surface, increasing the thermal conductance of the entire structure.

The above embodiments can be grown on conductive as well as insulating substrates, depending on the material system used. Normally, for an LED formed on a conductive substrate such as silicon carbide, a contact is deposited directly on the conductive substrate opposite the epitaxial layers. The current applied to the contact pad spreads through the substrate and to the n-type layer, which provides near uniform injection of electrons into the active layer. Alternatively, the LED core can be etched in a similar fashion as described above, with the etch proceeding to the conductive substrate if desired. If the substrate is conductive, it is considered part of the first spreader.

By using the array of contact fingers instead of the traditional substrate contact pad, the series resistance of the diode can be reduced. First, the contact resistance can be lower since optimal material can be used for the second spreader as opposed to the substrate. Second, the distance that the current has to travel before reaching the active region is much lower and has many parallel paths as compared to contacting the substrate, reducing the series resistance even further. The materials and contact details will determine which approach provides the lowest resistance.

Although the present invention has been described in considerable detail with reference to certain preferred configurations thereof, other versions are possible. The conductive fingers can have many different shapes and patterns and can be deposited on the LEDs layers in different ways. Therefore, the spirit and scope of the appended claims should not be limited to their preferred versions contained therein.

We claim:

1. A semiconductor LED with current spreading structures, comprising:

two or more adjacent layers doped with impurities;

at least one groove etched through one or more of said layers, exposing a surface on or within one of said layers, said at least one groove beginning at a first edge of said layers and extending toward the opposite second edge;

a first contact having at least one elongated first conductive finger on said exposed surface within said at least one groove, such that current flows from said contact into said at least one first finger and into said layer with said exposed surface, said first contact and said at least one finger beginning at said first edge and extending toward said second edge; and a second contact having at least one elongated second conductive finger on the surface of said adjacent layers such that current flows from said second contact into said at least one conductive second finger and into said adjacent layers, said second contact and said at least one second conductive finger at said second edge and extending toward said first edge.

2. The semiconductor LED of claim 1, wherein said at least one second conductive finger and said at least one first conductive finger are generally parallel for a portion of their lengths.

3. The semiconductor LED of claim 1, wherein said at least one second conductive finger and adjacent said at least one first conductive finger are approximately uniform distance from one another to provide nearly uniform current injection into said two or more adjacent layers doped with impurities.

4. The semiconductor LED of claim 1, including one said first conductive finger, wherein said second contact and at least one conductive finger form a generally U-shaped conductive path, said first contact and said first conductive finger forming an elongated conductive path within said U-shaped path.

5. The semiconductor LED of claim 1, including one said first conductive finger, wherein said first contact and at least one conductive finger form a generally U-shaped conductive path, said second contact and said second conductive finger forming an elongated conductive path within said U-shaped path.

6. The semiconductor LED of claim 1, including a plurality of said first and second conductive fingers, said second conductive fingers forming a plurality of conductive paths from said second contact toward said opposite edge, said first fingers forming a plurality of conductive paths from said first contact toward said second contact, interdigitated between said second fingers.

7. A semiconductor LED with current spreading structures, comprising:

two or more adjacent layers doped with impurities;

at least one groove etched through one or more of said layers, exposing a surface on or within one of said layers;

a first contact having at least one first conductive finger on said exposed surface within said at least one groove, such that current flows from said contact into said at least one first finger, and into said layer with said exposed surface; and a second contact having at least one second conductive finger on the surface of said adjacent layers such that current flows from said second contact, into said at least one conductive second finger and into said adjacent layers, wherein said second contact is located near the center of the surface of said adjacent layers and said second conductive fingers form conductive paths from said second contact toward the edge of said surface of said adjacent layers, and said first conductive fingers form conductive paths from said first contact, toward said second contact interdigitated between said second conductive fingers.

8. A semiconductor LED with current spreading structures, comprising:

two or more adjacent layers doped with impurities;

at least one groove etched through one or more of said layers, exposing a surface on or within one of said layers;

a first contact having at least one first conductive finger on said exposed surface within said at least one groove, such that current flows from said contact into said at least one first finger, and into said layer with said exposed surface; and a second contact having at least one second conductive finger on the surface of said adjacent layers such that current flows from said second contact, into said at least one conductive second finger and into said adjacent layers, wherein said second contact is located in the center of the surface of said adjacent layers and further comprises two conductive branches forming conductive paths in opposite respective directions from said contact down a centerline of said surface, said second conductive fingers forming conductive paths generally orthogonal to said branches, said first fingers forming conductive paths from said first contact and from the edge of said surface, toward said branches interdigitated between said second fingers.

9. A semiconductor LED with current spreading structures, comprising:

two or more adjacent layers doped with impurities;

at least one groove etched through one or more of said layers, exposing a surface on or within one of said layers;

a first contact having at least one first conductive finger on said exposed surface within said at least one groove, such that current flows from said contact into said at least one first finger, and into said layer with said exposed surface; and a second contact having at least one second conductive finger on the surface of said adjacent layers such that current flows from said second contact, into said at least one conductive second finger and into said adjacent layers, wherein said at least one first and second conductive fingers comprises a plurality of said first and second conductive fingers, wherein said second fingers form generally parallel zig-zag conductive paths from said second contact, and said first fingers form generally parallel zig-zag conductive paths from said first contact interdigitated between said second zig-zag fingers.

10. A scalable light emitting diode (LED) with enhanced current spreading structures, comprising:

an epitaxially grown p-type layer;

an epitaxially grown n-type layer;

an epitaxially grown active layer between said p-type and n-type layers;

a first contact having at least one first conductive finger;

at least one groove etched through said p-type and active layers to said n-type layer, said groove extending from a first edge of said n-type layer toward its opposite edge, said first contact and at least one finger on said n-type layer in said groove;

a second contact and at least one second conductive finger on said p-type layer, wherein said second contact is at the edge of said p-type layer opposite said n-type first edge and said at least one second finger extending toward said n-type first edge, said at least one first and second conductive fingers are generally parallel for at least a portion of their lengths.

* * * * *